US010768861B1

(12) United States Patent
Huang et al.

(10) Patent No.: US 10,768,861 B1
(45) Date of Patent: Sep. 8, 2020

(54) IN-PLACE SAFE DECOMPRESSION (71) Applicant: Microsoft Technology Licensing, LLC, Redmond, WA (US)

(72) Inventors: Xin Huang, Bothell, WA (US); Derek E. Gladding, Poughquag, NY (US); Bartosz T. Nyczkowski, Redmond, WA (US); Michael Sterling, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/287,837

(22) Filed: Feb. 27, 2019

(51) Int. Cl.
*G06F 3/06* (2006.01)
*H03M 7/30* (2006.01)
*G06F 16/174* (2019.01)

(52) U.S. Cl.
CPC .......... *G06F 3/0661* (2013.01); *G06F 3/0608* (2013.01); *G06F 3/0631* (2013.01); *G06F 3/0673* (2013.01); *G06F 16/1744* (2019.01); *H03M 7/6005* (2013.01)

(58) Field of Classification Search
CPC ...... G06F 3/06–0689; G06F 2003/0691–0698; H03M 7/30–707
See application file for complete search history.

(56) References Cited

U.S. PATENT DOCUMENTS

| 5,673,206 | A | | 9/1997 | Jones, Jr. | |
|---|---|---|---|---|---|
| 5,729,668 | A | | 3/1998 | Claflin et al. | |
| 5,841,953 | A | * | 11/1998 | Rohatgi | H03M 7/425 358/1.15 |
| 5,901,277 | A | | 5/1999 | Chu et al. | |
| 6,523,102 | B1 | | 2/2003 | Dye et al. | |
| 7,079,051 | B2 | | 7/2006 | Storer et al. | |
| 9,431,074 | B2 | | 8/2016 | Harizopoulos et al. | |
| 9,665,951 | B2 | | 5/2017 | Rasmusson et al. | |
| 10,444,991 | B1 | * | 10/2019 | Lu | G06F 3/067 |
| 2005/0219075 | A1 | * | 10/2005 | Storer | H03M 7/30 341/51 |
| 2007/0083571 | A1 | | 4/2007 | Meller et al. | |
| 2010/0161567 | A1 | | 6/2010 | Makela | |
| 2018/0293028 | A1 | | 10/2018 | Abali et al. | |

OTHER PUBLICATIONS

"Functions to Calculate Approximate Memory Usage Needed for Compression and Decompression #389", Retrieved From: https://github.com/google/brotli/issues/389, Retrieved Date: Apr. 20, 2020, 3 pages.

"International Search Report & Written Opinion issued in PCT Application No. PCT/US20/017565", dated May 34, 2020, 11 Pages.

* cited by examiner

*Primary Examiner* — Nicholas J Simonetti
(74) *Attorney, Agent, or Firm* — Holzer Patel Drennan (57) ABSTRACT

A method for providing in-place safe decompression of a data stream includes utilizing a stored offset to allocate a memory space for a decompression operation. The stored offset represents a maximum offset by which a write pointer position of an output stream exceeds a read pointer position for a corresponding input stream during in-place decompression of the compressed data stream.

20 Claims, 6 Drawing Sheets

IN-PLACE SAFE DECOMPRESSION

BACKGROUND

Decompression of a data file typically entails allocating a first memory buffer to store a compressed input data stream and allocating a separate memory to receive a decompressed output stream. Although utilizing two separate memory buffers in this manner prevents potential overwrite of the read stream (compressed data) by the write stream (decompressed data), this dual-buffer memory allocation ties up significantly more memory than is actually used at any given time, reducing system capability to support other functions.

SUMMARY

A method of in-place safe decompression includes processing an instruction to decompress a compressed data stream that is stored in association with an in-place safe (IPS) offset. The IPS offset represents a maximum offset by which a write pointer position of an output stream exceeds a read pointer position for a corresponding input stream when the compressed data stream is decompressed in-place. A memory buffer is allocated with a size based on the IPS offset and a size of the output stream, and the data of the compressed data stream is decompressed in-place within the allocated memory space.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

DETAILED DESCRIPTION

Some specialized algorithms are written to be "in-place safe," meaning that they are designed to transform input using no auxiliary data structure. However, since decompression algorithms generate more bytes as output than they receive as input, "in-place" decompression introduces a risk that a write pointer of the decompressed output stream may run into the read pointer of the compressed data input stream and overwrite compressed data before it is processed for decompression. For this reason, existing in-place safe decompression algorithms are engineered to ensure a wide safety margin and are, in general, unable to offer compression ratios competitive with other more commonly-used decompression algorithms.

The herein disclosed processing techniques permit any stream-oriented decompression algorithm to be executed in a manner that is "in-place safe." A decompression algorithm is referred to herein as being "in-place safe" when the algorithm is capable of reading from and writing to a same memory buffer while guaranteeing that no data of the input stream is overwritten by data of the output stream until that data is operated on and transformed into a corresponding output. For example, a compressed data stream may be stored in a first subset of a memory buffer and the corresponding uncompressed data stream may be written to a second subset of the same memory buffer. Although there may be some overlap between the subsets of data blocks storing the compressed data and uncompressed data, the data is stored and operated on in a manner that ensures the write pointer of the output stream does not run into the read pointer of the input stream at any point in time.

According to one implementation, compressed data may be stored in association with an offset (referred to herein as an "in-place safe (IPS) offset") that is computed at compression time. This offset is indicative of a minimum size of a memory buffer allocable to ensure in-place safe decompression of the associated data using a select decompression algorithm. Ultimately, this pre-computed, stored IPS offset allows decompression to be performed in-place (e.g., in a single memory buffer), without reducing efficacy of the selected decompression algorithm. Consequently, the disclosed techniques facilitate in-place safe use of some of the most powerful and popular compression and decompression algorithms in a manner that frees up significant processing resources for other system tasks.

Figure 1:
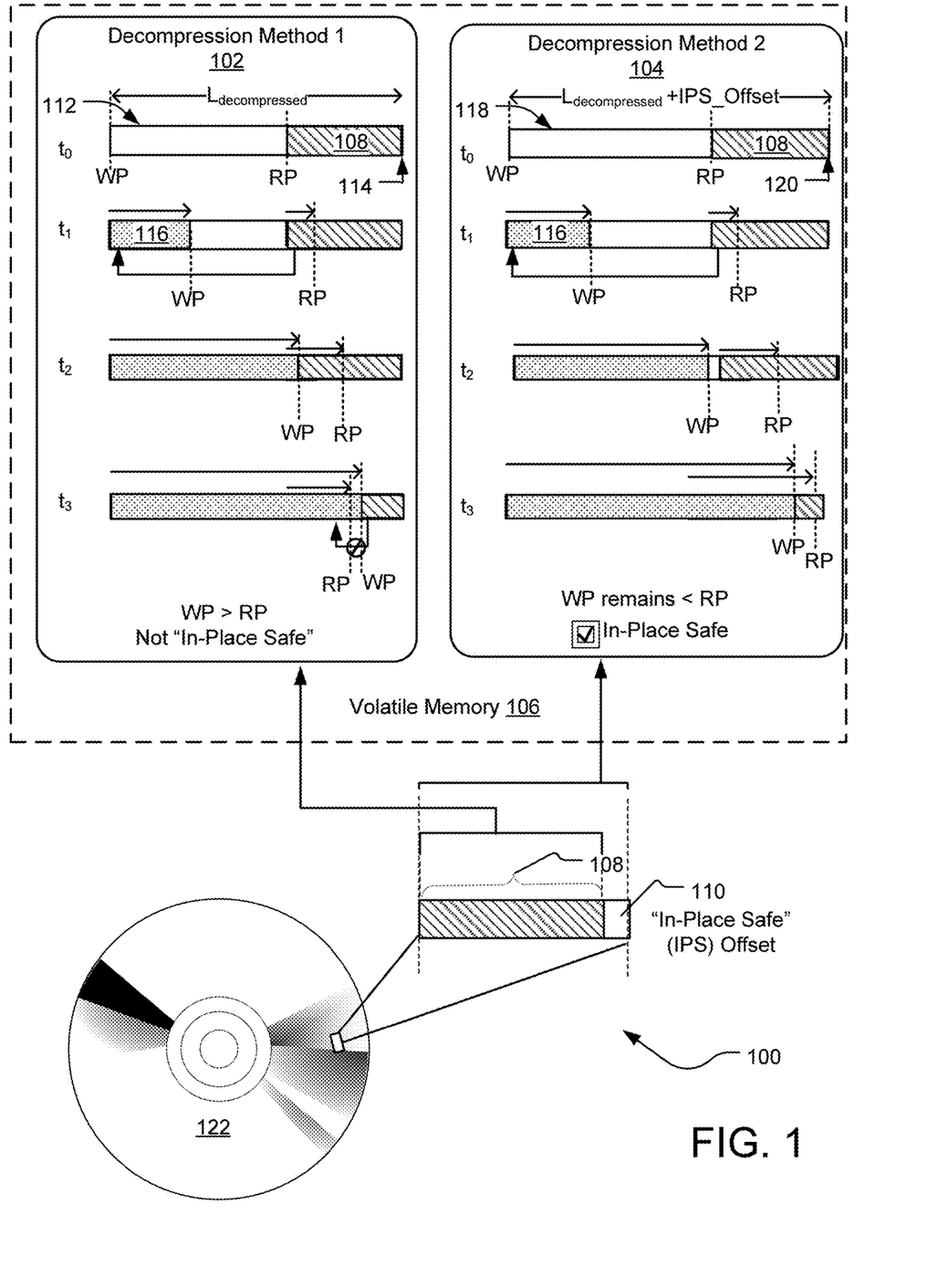
FIG. 1 illustrates an example system that performs in-place decompression on a compressed data stream according to two different methodologies.

FIG. 1 illustrates an example system 100 that performs in-place decompression on a compressed data stream 108 according to two different methodologies. The compressed data stream 108 is stored in non-volatile storage 122, such as a magnetic disk, solid-state device, F-RAM, MRAM, Flash memory, etc. For example the non-volatile storage 122 may be included within a mobile device (e.g., phone, tablet), a gaming console, a personal computer, external hard drive, cloud-based server, etc.

Prior to the state illustrated by FIG. 1, the compressed data stream 108 is compressed using a select stream-oriented compression algorithm, which may vary from one implementation to another. The term "stream-oriented" refers to an algorithm that operates sequentially on elements of an input stream to generate the associated output stream. Example stream-oriented compression algorithms include without limitation, Zlib, GZip, LZ77, LZ78, LZW, LZMA, Brotli, Zstd.

In FIG. 1, the compressed data stream 108 has been stored along with an in-place safe (IPS) offset 110 that is determined at compression time. When this stored offset is utilized to allocate memory during a decompression process, the compressed data stream 108 can be safely decompressed in-place (e.g., in a single contiguous memory space), even if the select compression algorithm is not, in itself, designed to be safely executed in such manner.

To illustrate the utility and purpose of the IPS offset 110, FIG. 1 illustrates two different decompression methods 102 and 104. Both of the decompression methods 102 and 104 are examples of "in-place" decompression. However, the decompression method 104 is "in-place safe" while the decompression method 102 is not "in-place safe."

The decompression method 102 (at left) illustrates an example of unsafe in-place decompression that does not utilize the IPS offset 110. Responsive to a decompression request initiated processing device, the system 100 allocates a memory buffer 112 in volatile memory 106 (e.g., RAM, DRAM, S-RAM) to receive the compressed data stream 108 and to also serve as a write location for a corresponding output stream of decompressed data. The memory buffer 112 is, in one implementation, a sequential contiguous sequence of memory blocks. For example, the memory buffer 112 may coincide with a range of consecutive logical addresses that sequentially increase from the beginning of the memory buffer 112 to an end of the memory buffer 112 (e.g., from left-to-right within the memory buffer 112).

In this first approach, the memory buffer 112 has a length equal in size to a size of the decompressed data ($L_{decompressed}$) corresponding to the compressed data stream 108. This length ($L_{decompressed}$) is, for example, determined at the time that the data is initially compressed and stored in metadata associated with the compressed data stream 108.

At a first time ($t_0$) during the decompression method 102, the compressed data stream 108 is placed at an end 114 of the memory buffer 112, such that the last byte of the compressed data stream is stored within the last physical block of the memory buffer 112. A read pointer (RP) is placed to indicate a first block of the compressed data stream 108, and a write pointer (WP) is placed at the beginning block of the memory buffer 112.

A select decompression algorithm begins reading the compressed data stream 108 starting at the position of the read pointer (RP) and continuing in the forward direction toward the end 114 of the allocated memory buffer 112. As the data is sequentially read and operated upon, the decompression algorithm writes a corresponding decompressed data stream 116 starting at the position of the write pointer (WP) and continuing in the forward direction. As the decompression algorithm reads the compressed data stream 108 and outputs individual values of the decompressed data stream 116, the system 100 continuously updates the RP and WP positions. States of the memory buffer 112 are illustrated at each of three subsequent times, $t_1$, $t_2$, and $t_3$. At the time $t_1$, a first portion of the decompressed data stream 116 is written, but the WP still lags significantly behind the read pointer. At the time $t_2$, the write pointer (WP) position coincides with the initial position (e.g., the to position) of the read pointer (RP). However, this is not yet problematic since this first portion of the compressed data stream has already been read and acted upon by the decompression algorithm. By the time $t_3$, however, the write pointer (WP) position has exceeded the position of the read pointer (RP) and a portion of the compressed data that has not yet been processed by the decompression algorithm has been overwritten. This results in data corruption and/or system error.

In contrast to the decompression method 102, the decompression method 104 (at right) illustrates a use of the IPS offset 110 that ensures the decompression is in-place safe. According to this second approach, the system 100 utilizes the IPS offset to select the size of the memory buffer responsive to a decompression request. In this scenario, the system 100 allocates a memory buffer 118 that has a length equal in size to at least the sum of the decompressed data stream length ($L_{decompressed}$) and the stored IPS offset 110.

Aside from the length, the memory buffer 118 may have features similar or identical to the memory buffer 112. At a first time ($t_0$) during the decompression method 104, the compressed data stream 108 is placed at an end 120 of the memory buffer 118, such that the last byte of the compressed data stream is stored within the last physical block of the memory buffer 118.

Like the decompression method 102, a read pointer (RP) is placed to indicate a first block of the compressed data stream 108 and a write pointer (WP) is placed to mark a first available block in the memory buffer 118 (e.g., the block with the lowest logical block address). The select decompression algorithm then begins reading the compressed data stream 108 from the read pointer (RP) in the forward direction toward the end 120 of the memory buffer 118. For each byte of data read as input, the select decompression algorithm generates one or more output bytes that are sequentially written (e.g., as the decompressed stream 116) beginning at the position of the write pointer (WP). As the decompression algorithm reads the compressed data stream 108 and outputs individual values of the decompressed data stream 116, the RP and WP positions are continuously updated.

Due to the size of the memory buffer 118 that is based on the IPS offset 110 and the decompressed data size, the write pointer (WP) lags behind the position of read pointer (RP) throughout the entire decompression process (e.g., $t_0$, $t_1$, $t_2$, $t_3$). This allows the decompression to complete safely in-place even though the decompression algorithm employed is not, in itself, designed to be executed in-place.

Figure 2:
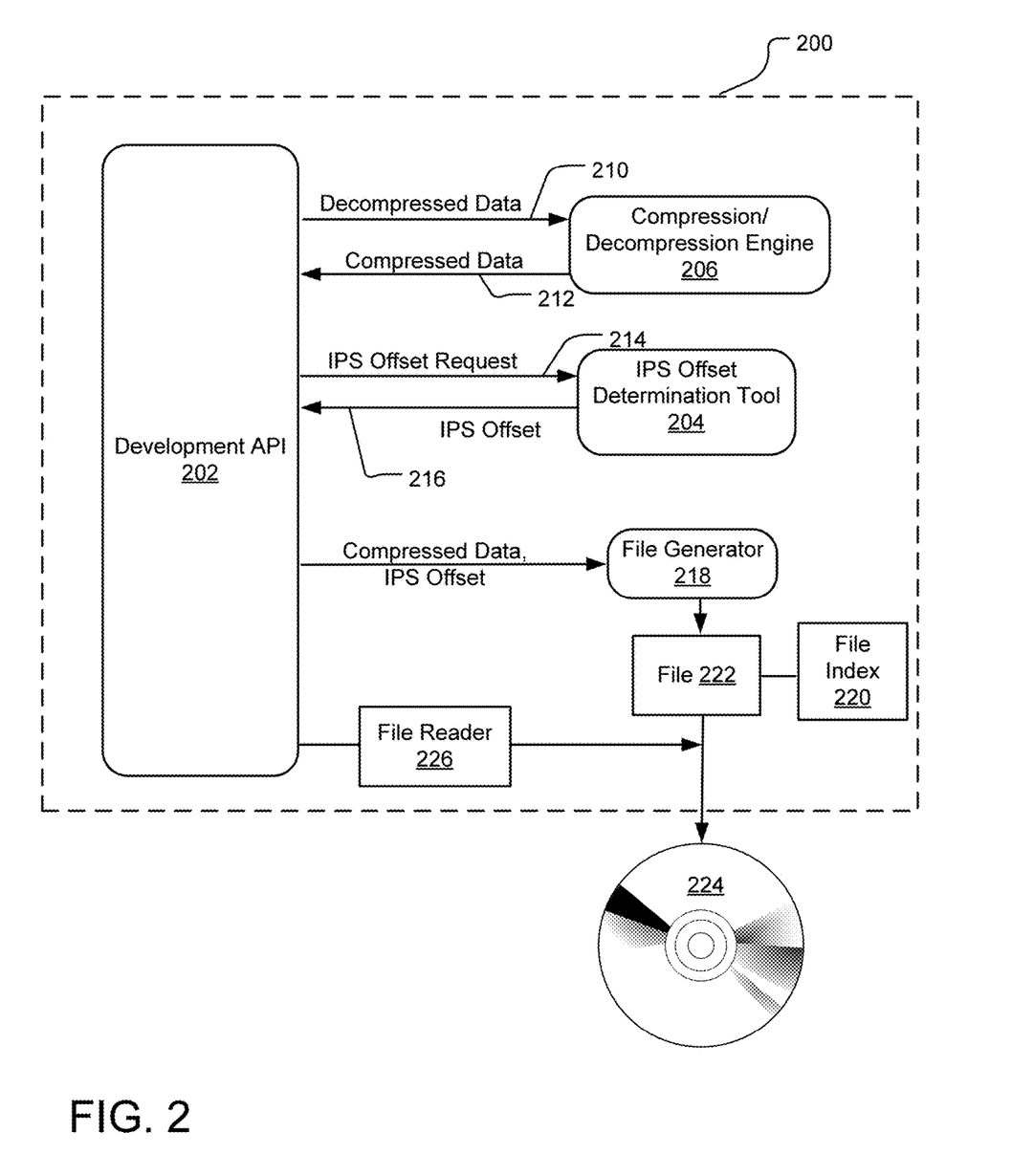
FIG. 2 illustrates an example system for computing an in-place safe (IPS) offset that facilitates in-place safe data decompression.

FIG. 2 illustrates an example system 200 for computing an in-place offset (IPS) that facilitates in-place safe data decompression. In this system 200, a software developer uses a development API 202 to perform various actions for finalizing and packaging a software product. The development API 202 provides a decompressed data stream 210 of the software product to a designated compression/decompression engine 206. The compression/decompression engine 206 executes a stream-oriented compression routine on the data and outputs a compressed data stream 212.

Figure 3:
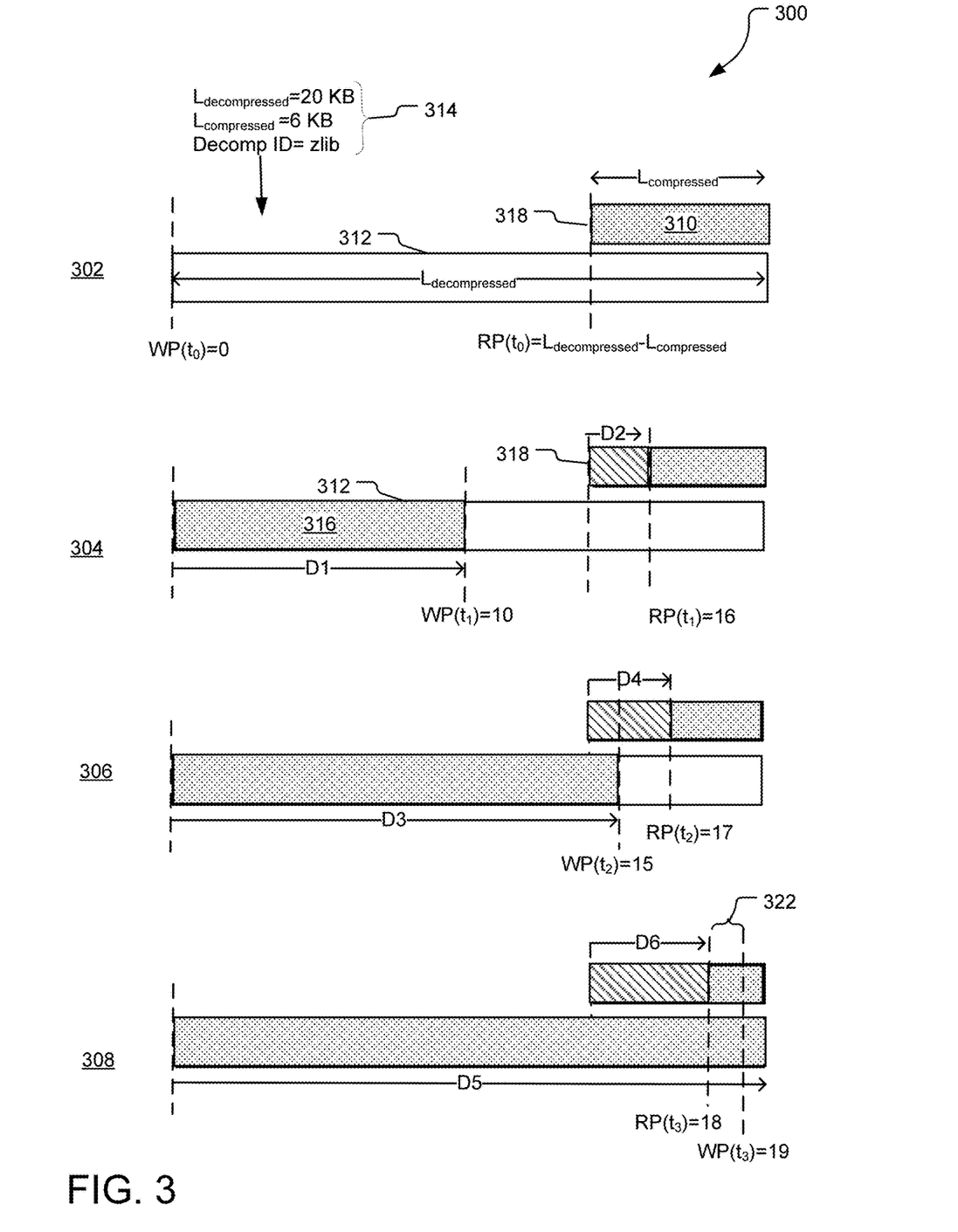
FIG. 3 illustrates example operations performed by a system that calculates an IPS offset usable to size a memory buffer to guarantee in-place safe decompression of a compressed data stream.

The development API 202 then transmits an IPS offset request 214 for an IPS offset to the IPS offset determination tool 204. In one implementation, the IPS offset request includes both the compressed data stream 212 and an identifier usable by the IPS offset determination tool 204 to identify the compression/decompression engine 206 used in the prior compression step. The IPS offset determination tool 204 loads the compressed data stream 212 into a temporary read buffer and calls on the compression/decompression engine 206 to read from the temporary read buffer and write outputs (the decompressed data stream 210) to a temporary write buffer. During this decompression, the IPS offset determination tool 204 monitors a read pointer of the input stream and a write pointer of the output stream to calculate a maximum offset by which the write pointer position may exceed the read pointer position during an in-place decompression of the compressed data stream 212. This maximum offset is returned as the IPS offset 216. FIG. 3, below, provides a detailed example of operations that may be performed by the IPS offset determination tool 204 to calculate the IPS offset.

Responsive to receiving the IPS offset 216 via the development API 202, the developer selects a format for packaging a collection of assets including the compressed data stream 212 (e.g., the packaged software product), the IPS offset 216, and other select metadata. These assets are provided to a file generator 218, which in turn, creates a file 222 storing the collection of assets. Although the specific data included in the file 222 may take on different forms in different implementations, the file 222 may, for example, contain assets such as the compressed data, a size of the compressed data, a size of the corresponding decompressed data, and the IPS offset.

According to one implementation, the file generator 218 creates a file index 220 usable to locate each of the individual assets within the file 222. For example, the file index 220 may include an ID of the software product, a location indicating the start of the compressed data stream 212 within the file 222, a size of the compressed data stream 212, a size of the corresponding decompressed data stream 210, and the IPS offset 216. In some implementations, the IPS offset 216 may be stored in a location external to the file 222. In such cases, the file index 220 and/or the file 222 may include a pointer to the external location of the IPS offset 216. The file 222 may be placed in a permanent storage location 224, such as a server location where the file is available for download.

In addition to instructing the file generator 218 to generate the file 222, the developer may also write a file reader 226 and used by a processing device (e.g., a user machine) to read the file 222. In some cases, the file reader 226 is made available for download with the file 222. In other cases, the file reader 226 is installed on the user's machine at a time different from the download of the file 222. For example, the file reader 222 may be included within a web browser engine. This file reader 226 is, for example, an executable including code for reading information from the file index 220; allocating a memory buffer (e.g., based on the size of the decompressed data stream 210 and the IPS offset 216), and/or allocating a specific subset of the memory buffer for receipt of the compressed data stream 212. The executable 226 may further include code for reading the compressed data stream 212 into the allocated memory buffer, calling a decompression API (not shown), and providing the decompression API with parameters such as: the size of the allocated memory buffer (e.g., a sum of the IPS offset and size of the decompressed data), read pointer location indicating a start of the compressed data within the memory buffer, a write pointer location indicating a write start location for decompressed data, and a size of the compressed data.

During decompression, a processing device (e.g., a user machine) runs the file reader 226 and thereby provides the decompression API with the information for safely decompressing the compressed data stream 212 in-place within the designated memory buffer.

In one implementation, the user machine utilizes the stored IPS offset to decompress the data in a manner the same or similar to that described with respect to FIG. 1 (e.g., decompression method 104). Notably, the above-described methodology entails work on the back-end (e.g., computing the IPS offset at the time of data compression) to reduce memory requirements on the front-end (e.g., at the time of data decompression). This model works particularly well for data files that are compressed once and decompressed repeatedly. For example, a gaming asset may be produced (compressed) once, but read and decompressed multiple times during play sessions of a game. However, this model can also be beneficial for the "compress once, decompress once" scenario, particularly if the processor performing the compression has increased computing resources as compared to the processor performing the decompression. For example, cloud-based services with ample computing resources may prepare software products for download and decompression on a mobile devices with comparatively limited computing resources. When these software products are compressed and stored with an IPS offset (as described above), the mobile devices can devote fewer processing resources to decompressing such data.

FIG. 3 illustrates example operations performed by a system 300 that calculates an in-place safe (IPS) offset usable to size a memory buffer to guarantee in-place safe decompression of a compressed data stream. According to one implementation, the illustrated operations of FIG. 3 are performed by a development tool, such as the IPS offset determination tool 204 of FIG. 2. At a time $t_0$, the system 300 is in a first state 302 performing memory allocation actions for a decompression operation. The system 300 has received a compressed data stream 310 along with a collection of parameters 314, such as a parameter identifying a select decompression engine (e.g., "Decomp ID"), a size of the compressed data stream (e.g., "$L_{compressed}$") to be input to the decompression engine, and a size of a decompressed data stream (e.g., "$L_{decompressed}$") expected as output from the select decompression engine. In one implementation, the decompression engine is a module of a run-time library accessible by the system 300.

In the example shown, the decompressed data stream has a length of 6 KB and the compressed data stream has a length of 20 KB. The Decomp. ID variable indicates that a decompression algorithm "zlib" is to be used to decompress the compressed data stream.

The system 300 allocates a first memory space 318 with a length equal to the size of the compressed data stream 310 (e.g., $L_{compressed}$=6 KB). The compressed data stream 310 is read into this first memory space 318. The system 300 also allocates second memory space 312 for receiving outputs of the "zlib" decompression module. This second memory space 312 has a length equal to the size of the uncompressed data stream (e.g., $L_{decompressed}$=20 KB). The system 300 defines a write pointer (WP) with an initial position WP($t_0$)= 0, corresponding to a starting memory block of the second memory space 312. Additionally, the system 300 defines a read pointer (RP) with an initial position corresponding to a starting block of the first memory space 318. This RP starting index, RP($t_0$) is defined as equal to the difference between $L_{decompressed}$ and $L_{compressed}$ (e.g., 20 KB−6 KB=14 KB).

The system 300 calls on the decompression engine (zlib) with a request to read the compressed data stream 310 from the first memory space 318 and to write an output stream (e.g., a decompressed data stream 316) to the second memory space 312. As the compressed data stream 310 is read and decompressed, the system 300 updates the position of WP and RP accordingly, tracking the values of these pointers in relation to one another.

States 304, 306, and 308 illustrate the first memory space 318 and the second memory space 312 along with the positions of WP and RP at subsequent times $t_1$, $t_2$, and $t_3$, respectively. At the time $t_1$, the write pointer (WP) has moved by a distance D1 and now assumes the value 10 KB. The read pointer (RP), in contrast, has moved by a distance D2 and now assumes the value 16 KB. At the time $t_2$, the write pointer (WP) has moved by a total distance D3 and now assumes the value 15 KB. The read pointer (RP), in contrast, has moved by a total distance D4 and now assumes the value 17 KB. At this point in time, the WP value has surpassed the starting value of the RP; however, the WP still lags just behind the RP.

By the time $t_3$ (shown by state 308), the write pointer (WP) has moved by a total distance D5 and now assumes the index value 19 KB. The read pointer (RP), in contrast, has moved by a total distance D6 and now assumes the value 18 KB. Here, the WP has jumped ahead of the RP by an offset 322 (e.g., 1 KB).

As soon as the WP index value jumps ahead of the RP index value, the system 300 records the offset 322 (e.g., WP-RP). The system 300 monitors the value of this offset as the decompression routine continues, updating the recorded offset value each time the offset increases. At the end of the decompression, both RP and WP have a value of $L_{decompressed}$ and the final offset that is stored represents the maximum offset between the pointers WP and RP (e.g., Max(WP-RP)). This value is identified as the in-place offset (IPS offset) and output to a content production platform where it may be packaged within a file containing the compressed data stream.

Throughout the above-described process, it is assumed that the decompression engine reads from the compressed data stream 310 one byte at a time and outputs everything that can be decompressed from reading that byte before moving forward and reading the next byte. If the above pointer-tracking techniques are utilized along with a decompression algorithm that performs certain optimizations for speed, such as optimizations that include reading ahead from the input stream before outputting everything that can be decompressed, the system may not accurately determine the IPS offset between the write pointer and the read pointer of corresponding input/output bytes. As such, the system 300 may, in some implementations, perform actions to disable read-ahead optimizations and/or otherwise ensure that the decompression engine acts at each point in time to generate as many output bytes as possible from the already-consumed input data stream.

Figure 4:
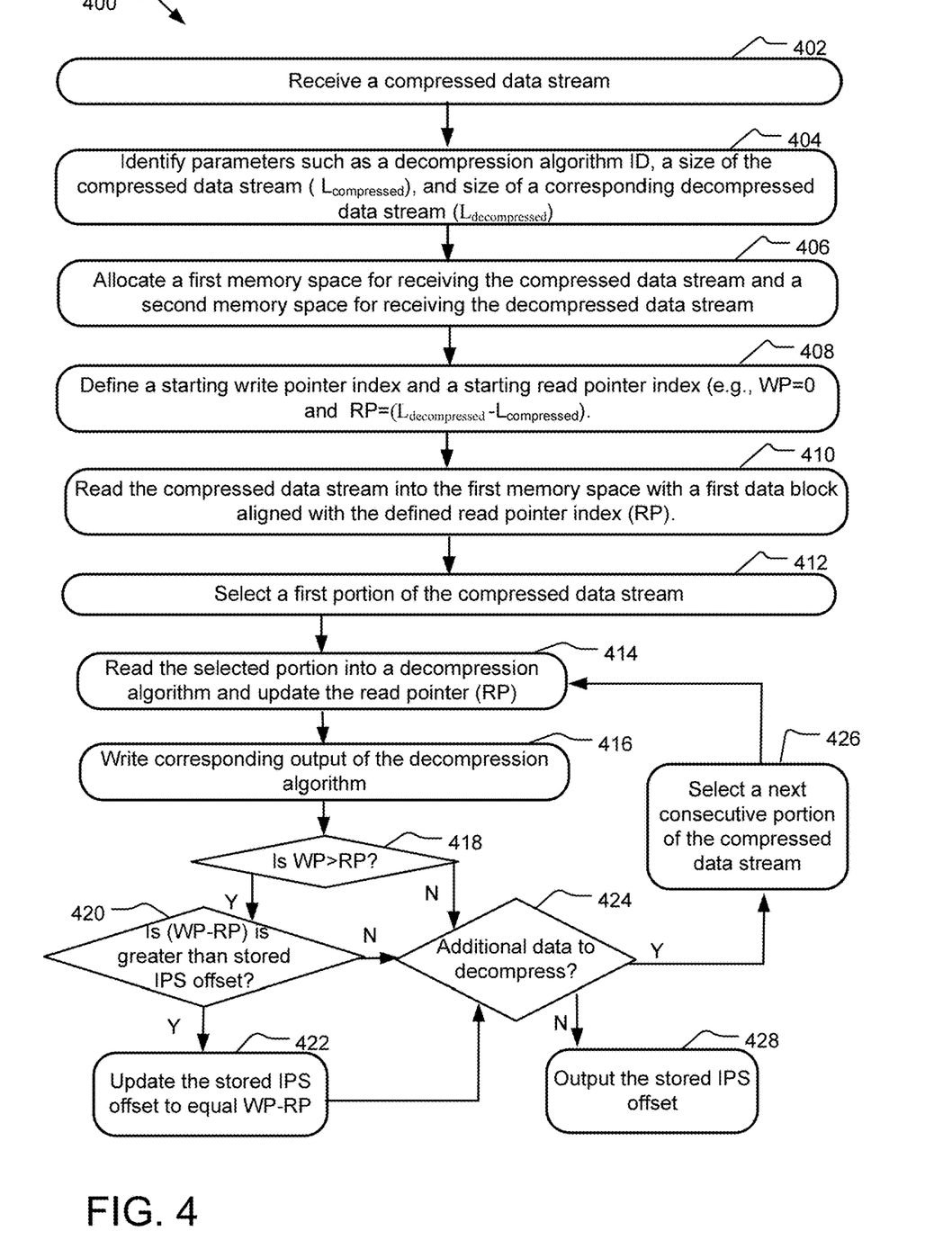
FIG. 4 illustrates example operations for determining an IPS offset usable to size a memory buffer that guarantees in-place safe decompression of a compressed data stream.

FIG. 4 illustrates example operations 400 for determining an in-place safe offset (IPS) offset usable to size a memory buffer that guarantees in-place safe decompression of a compressed data stream. According to one implementation, the operations 400 mirror those described with respect to the system 300. A first receiving operation 402 receives a compressed data stream. A parameter identification operation 404 identifies parameters including a decompression algorithm ID (e.g., an ID uniquely identifying a decompression algorithm from an available run-time library), a size of the compressed data stream ($L_{compressed}$), and size of a decompressed data stream ($L_{decompressed}$) expected as output when the compressed data stream is provided as input the select decompression algorithm.

A memory allocation operation 406 allocates a first memory space for receiving the compressed data stream and a second memory space for writing the decompressed data stream. A pointer initialization operation 408 defines a write pointer (WP) index (WP=0) that initially points to a first block of the second memory space. The pointer initialization operation 408 also defines a read pointer index (RP) corresponding to a start of the first memory space (e.g., a first block of the compressed data stream). This read pointer index is initially set equal to a difference between the decompressed data size ($L_{decompressed}$) and the compressed data size ($L_{compressed}$) (e.g., RP=$L_{decompressed}$-$L_{compressed}$). A read operation 410 reads the compressed data stream into the first memory space with a first data block aligned with the defined read pointer index (RP).

A selection operation 412 selects a first portion (e.g., a first byte) of the compressed data stream. A reading operation 414 read the first portion as input to the select decompression algorithm and updates the read pointer (RP) accordingly. A writing operation 416 writes output of a decompression algorithm (e.g., the decompression algorithm identified by the decompression algorithm ID) to the second memory space beginning at the current WP position and updates the WP accordingly. The output data stream is written sequentially, in a forward direction, across a series of contiguous memory blocks within the second memory space.

A determination operation 418 determines whether the current write pointer index (WP) is greater than the current read pointer index (RP). If so, another determination operation 420 determines whether the offset WP-RP is greater than a current value stored as the IPS offset. (Note: upon initial evaluation of the determination operation 418, the stored IPS offset is set to zero. In this case, the stored IPS offset is updated with a non-zero value the first time that the determination operation 418 determines that the WP index is greater than the RP index).

Provided that the difference between WP and RP is greater that the stored IPS offset, an updating operation 422 updates the stored IPS offset to equal the current offset value (WP-RP). A determination operation 424 determines whether there remains additional data in the compressed data stream to be decompressed. If so, a selection operation 426 selects a next sequential, consecutive portion of the compressed data stream (e.g., the next byte in the stream), and the operations 414, 416, 418, 420, 422, and 424 repeat until the entire compressed data stream has been decompressed. Once all data of the compressed data stream has been decompressed by the select decompression algorithm, an output operation 428 outputs the stored IPS offset. This stored IPS value represents a maximum value difference between WP and RP during the decompression process.

Figure 5:
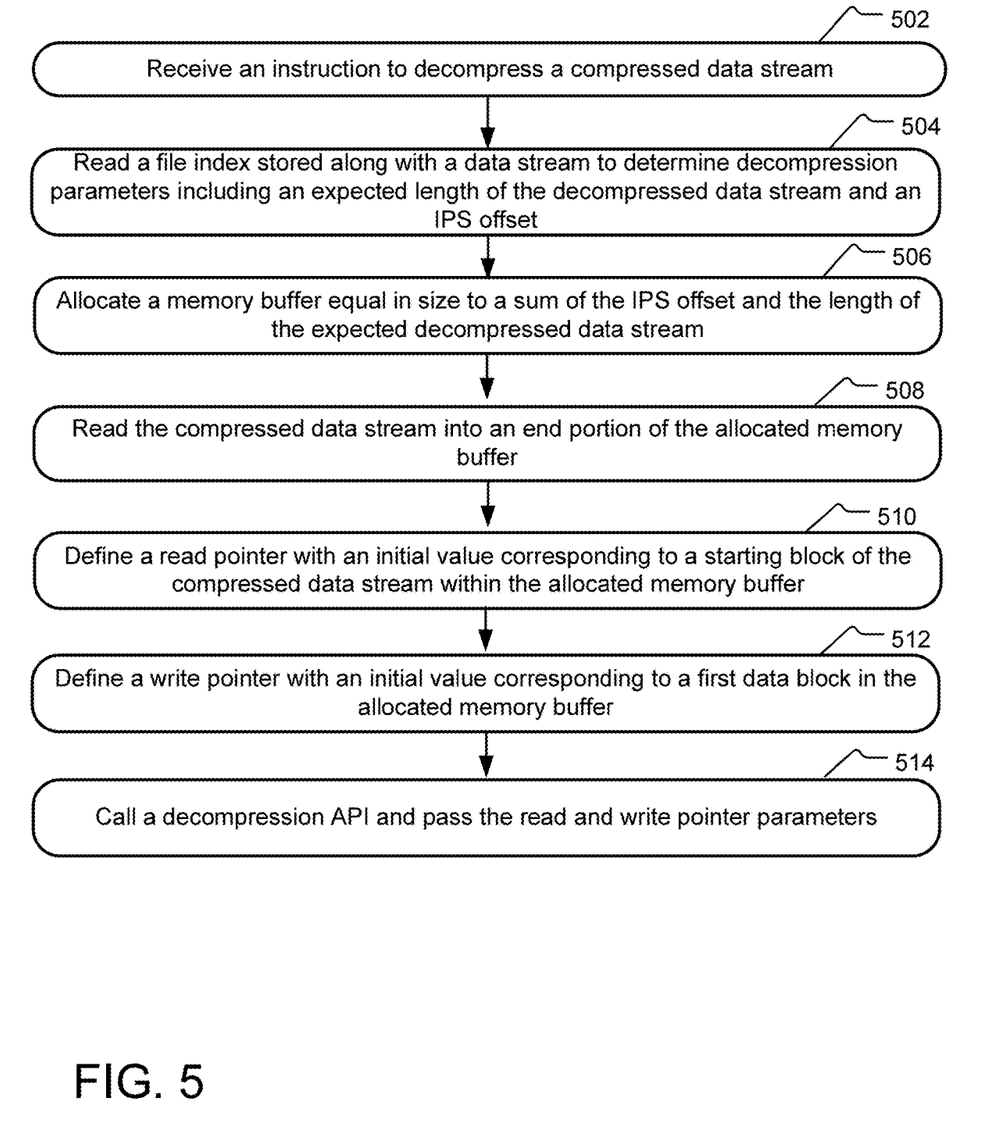
FIG. 5 illustrates example operations for decompressing data using a stored IPS offset value.

FIG. 5 illustrates example operations 500 for decompressing data using a stored IPS offset value. A receiving operation 502 receives an instruction to decompress a data stream residing in a permanent storage location, such as from a hard drive disk or solid state memory. The instruction is processed according to operations 504, 506, 508, 510, and 512.

First, a reading operation 504 reads a file index stored along with the data stream to determine decompression parameters including an expected length of the decompressed data stream and an IPS offset. The IPS offset is, in one implementation, calculated initially in a same or similar manner to that described above with respect to FIG. 3-4. These parameters may, for example, be specified directly within the file index or stored at a location indicated by the file index. A memory allocation operation 506 allocates a memory buffer equal in size to a sum of the IPS offset and the length of the expected decompressed data stream, and a reading operation 508 reads the data stream of compressed data into an end portion of the allocated memory buffer. For example, the data stream may be stored across a continuous range of sequential physical memory blocks located at an end of the memory buffer such that the last byte of the data stream is stored in the last physical block of the allocated memory buffer (e.g., as shown with respect to decompression method 104 of FIG. 1).

A read pointer definition operation 510 defines a read pointer with a starting value corresponding to the start of the compressed data within the memory buffer. For example, the read pointer starting value is set to equal the physical block that stores the first byte of the compressed data stream. A write pointer definition operation 512 defines a write pointer with an initial value corresponding to a first block (e.g., with a lowest logical block address) in the memory buffer.

A decompression API calling operation 514 calls a decompression API and passes the read pointer and write pointer parameters for a decompression operation. In response, a decompression algorithm reads the compressed data stream sequentially from the end portion of the memory buffer (e.g., in the forward direction toward the end of the buffer) and writes the decompressed data stream sequentially to a beginning portion of the memory buffer (e.g., from the start of the buffer and in the forward direction). Due to the use of the IPS offset for initial sizing of the memory buffer and the initial placement of read and write pointers, the write pointer does not surpass the read pointer (e.g., the decompression is in-place safe).

Figure 6:
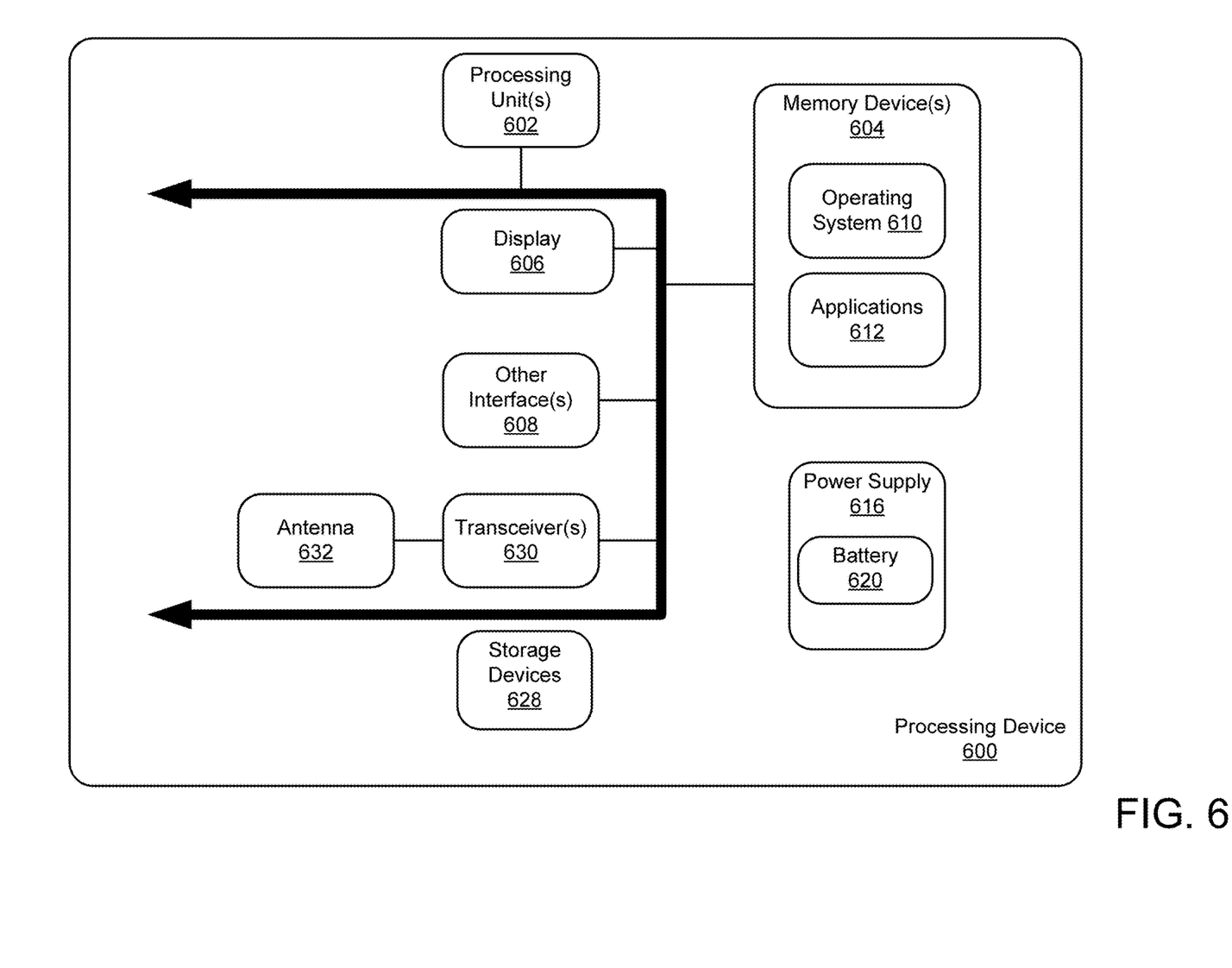
FIG. 6 illustrates an example schematic of a processing device that may be suitable for implementing aspects of the disclosed technology.

FIG. 6 illustrates an example schematic of a processing device 600 that may be suitable for implementing aspects of the disclosed technology. The processing device 600 includes one or more processor unit(s) 602, memory 604, a display 606, and other interfaces 608 (e.g., buttons). The memory 604 generally includes both volatile memory (e.g., RAM) and non-volatile memory (e.g., flash memory). An operating system 610, such as the Microsoft Windows® operating system, the Microsoft Windows® Phone operating system or a specific operating system designed for a gaming device, resides in the memory 504 and is executed by the processor unit(s) 602, although it should be understood that other operating systems may be employed.

One or more applications 612 (e.g., such as the IPS offset determination tool 204 of FIG. 2 and/or the compression/decompression engine 206 of FIG. 2) are loaded in the memory 604 and executed on the operating system 610 by the processor unit(s) 602.

Applications 612 may receive input from various input local devices (not shown) such as a microphone, keypad, mouse, stylus, touchpad, joystick, etc. Additionally, the applications 612 may receive input from one or more remote devices, such as remotely-located smart devices, by communicating with such devices over a wired or wireless network using more communication transceivers 630 and an antenna 632 to provide network connectivity (e.g., a mobile phone network, Wi-Fi®, Bluetooth®).

The processing device 600 further includes storage device 628 and a power supply 616, which is powered by one or more batteries (e.g., a battery 620) and/or other power sources and which provides power to other components of the processing device 600. The power supply 616 may also be connected to an external power source (not shown) that overrides or recharges the built-in batteries or other power sources.

In an example implementation, an IPS offset determination tool includes hardware and/or software embodied by instructions stored in the memory 604 and/or storage devices 528 and processed by the processor unit(s) 602. The memory 604 may be the memory of a host device or of an accessory that couples to the host.

The processing device 600 may include a variety of tangible computer-readable storage media and intangible computer-readable communication signals. Tangible computer-readable storage can be embodied by any available media that can be accessed by the processing device 600 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the processing device 600. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some implementations may comprise an article of manufacture. An article of manufacture may comprise a tangible storage medium (a memory device) to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain operation segment. The instructions may be implemented using any suitable high-level, low-level, object-oriented, visual, compiled and/or interpreted programming language.

An example method disclosed herein provides for processing an instruction to decompress a compressed data stream that is stored in association with an in-place safe (IPS) offset; allocating a memory space for storing the input stream and the output stream during the in-place decompression of the compressed data stream; and decompressing the compressed data stream in-place within the allocated memory space. The IPS offset represents a maximum offset by which a write pointer position of an output stream exceeds a read pointer position for a corresponding input stream during in-place decompression of the compressed data stream, and the memory space allocated is of a size selected based on the IPS offset and a size of the output stream.

In another example method of any preceding method, the size of the allocated memory space is equal to a sum of the IPS offset and the size of the output stream.

In still another example method of any preceding method, the IPS offset further represents the maximum offset by which the write pointer position of the output stream exceeds the read pointer position for the input stream when a write pointer for the output stream is initialized at a zero value and read pointer for the input stream is initialized at a value equal to a difference between a length of the output stream and a length of the input stream.

Still another example method of any preceding method includes reading the data of the compressed data stream sequentially into a continuous end portion of the allocated memory space.

In yet still another example method of any preceding method, the last byte in the compressed data stream is stored in a last physical block in the allocated memory space.

In yet still another example method of any preceding method, decompressing the compressed data stream in-place further comprises sequentially writing values of the output stream starting at a first data block in the allocated memory space.

In another example method of any preceding method, the memory space is a continuous sequence of sequential physical blocks.

An example system disclosed herein includes a means for processing an instruction to decompress a compressed data stream that is stored in association with an in-place safe (IPS) offset; a means for allocating a memory space for storing the input stream and the output stream during the in-place decompression of the compressed data stream; and a means for decompressing the compressed data stream in-place within the allocated memory space. The IPS offset represents a maximum offset by which a write pointer position of an output stream exceeds a read pointer position for a corresponding input stream during in-place decompression of the compressed data stream, and the memory space allocated is of a size selected based on the IPS offset and a size of the output stream.

An example system disclosed herein includes an in-place safe (IPS) offset determination tool, a file generator, and a file reader. The IPS offset determination tool tracks locations of a read pointer and a writer pointer while decompressing a compressed data stream and identifies, based on the tracked locations, an IPS offset representing a maximum offset by which a position of the write pointer exceeds a position of the read pointer. The file generator stores the compressed data stream in association with a location of IPS offset and the file reader allocates a memory space for decompressing the compressed data stream, the memory space having a size based on the IPS offset.

In another example system according to any preceding system, the size of the allocated memory space is equal to a sum of the IPS offset and a size of a decompressed data stream saved in association with the compressed data stream.

In yet still another example system of any preceding system, the memory space is a continuous sequence of sequential physical blocks.

In still another example system of any preceding system, the IPS offset determination tool tracks locations of the read pointer and the write pointer by initializing a write pointer to a zero index equal; initializing a read pointer to an index equal to a difference between an expected length of a decompressed data stream and a length of the compressed data stream; updating the read pointer with each byte of data that is read from the compressed data stream; and updating the write pointer with each byte of data that is written to the decompressed data stream.

In another example system of any preceding system, the IPS offset and the compressed data stream are stored in same data file.

In another example system of any preceding system, the file reader is stored along with the data file and selectively executable to for download by a user device.

An example memory device disclosed herein stores processor-readable instructions for executing a computer process comprising: processing an instruction to decompress a compressed data stream stored in association with an in-place safe (IPS) offset; allocating a memory space for storing the input stream and the output stream during the in-place decompression of the compressed data stream; and decompressing the compressed data stream in-place within the allocated memory space. The IPS offset represents a maximum offset by which a write pointer position of an output stream exceeds a read pointer position for a corresponding input stream during in-place decompression of the compressed data stream, and the allocated memory space has a size that is selected based on the IPS offset and a size of the output stream.

In an example memory device of any preceding memory device, the wherein the size of the allocated memory space is equal to a sum of the IPS offset and the size of the output stream. In still another example memory device of any preceding memory device, the IPS offset represents a maximum offset by which the write pointer position of the output stream exceeds the read pointer position for the input stream when a write pointer for the output stream is initialized at a zero value and read pointer for the input stream is initialized at a value equal to a difference between a length of the output stream and a length of the input stream.

In yet still another example memory device of any preceding memory device, the computer process further comprises reading the data of the compressed data stream sequentially into a continuous end portion of the allocated memory space.

In still another example memory device of any preceding memory device, a last byte in the compressed data stream is stored in a last physical block in the allocated memory space.

In yet still another example memory device of any preceding memory device, decompressing the compressed data stream in-place further comprises sequentially writing values of the output stream starting at a first data block in the allocated memory space.

In another example memory device of any preceding memory device, the memory space is a continuous sequence of sequential physical blocks. The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A method comprising:
processing an instruction to decompress a compressed data stream stored in association with an in-place safe (IPS) offset, the IPS offset representing a maximum offset by which a write pointer position of an output stream exceeds a read pointer position for a corresponding input stream during in-place decompression of the compressed data stream;
allocating a memory space for storing the input stream and the output stream during the in-place decompression of the compressed data stream, the memory space having a size selected based on the IPS offset and a size of the output stream; and
decompressing the compressed data stream in-place within the allocated memory space.

2. The method of claim 1, wherein the size of the allocated memory space is equal to a sum of the IPS offset and the size of the output stream.

3. The method of claim 1, wherein the IPS offset further represents the maximum offset by which the write pointer position of the output stream exceeds the read pointer position for the input stream when a write pointer for the output stream is initialized at a zero value and read pointer for the input stream is initialized at a value equal to a difference between a length of the output stream and a length of the input stream.

4. The method of claim 1, further comprising:
reading the data of the compressed data stream sequentially into a continuous end portion of the allocated memory space, the continuous end portion corresponding with an end portion of the allocated memory space.

5. The method of claim 1, wherein a last byte in the compressed data stream is stored in a last physical block in the allocated memory space.

6. The method of claim 1, wherein decompressing the compressed data stream in-place further comprises sequentially writing values of the output stream starting at a first data block in the allocated memory space.

7. The method of claim 1, wherein the memory space is a continuous sequence of sequential physical blocks.

8. A system comprising:
memory; and
an in-place safe (IPS) offset determination tool stored in the memory that:
tracks locations of a read pointer and a writer pointer while decompressing a compressed data stream; and
identifies, based on the tracked locations, an IPS offset representing a maximum offset by which a position of the write pointer exceeds a position of the read pointer;
a file generator stored in the memory that stores the compressed data stream in association with a location of IPS offset; and
a file reader stored in the memory that allocates a memory space for decompression of the compressed data stream, the memory space having a size based on the IPS offset.

9. The system of claim 8, wherein the size of the memory space is equal to a sum of the IPS offset and a size of a decompressed data stream saved in association with the compressed data stream.

10. The system of claim 8, wherein the memory space is a continuous sequence of sequential physical blocks.

11. The system of claim 8, wherein the IPS offset determination tool tracks locations of the read pointer and the write pointer by:
initializing a write pointer to a zero index equal;
initializing a read pointer to an index equal to a difference between an expected length of a decompressed data stream and a length of the compressed data stream;
updating the read pointer with each byte of data that is read from the compressed data stream; and
updating the write pointer with each byte of data that is written to the decompressed data stream.

12. The system of claim 8, wherein the IPS offset and the compressed data stream are stored in same data file.

13. The system of claim 12, wherein the file reader is stored along with the data file and selectively executable to for download by a user device.

14. One or more memory devices storing processor-readable instructions for executing a computer process comprising:
processing an instruction to decompress a compressed data stream stored in association with an in-place safe (IPS) offset, the IPS offset representing a maximum offset by which a write pointer position of an output stream exceeds a read pointer position for a corresponding input stream during in-place decompression of the compressed data stream;
allocating a memory space for storing the input stream and the output stream during the in-place decompression of the compressed data stream, the memory space having a size selected based on the IPS offset and a size of the output stream; and
decompressing the compressed data stream in-place within the allocated memory space.

15. The one or more memory devices of claim 14, wherein the size of the allocated memory space is equal to a sum of the IPS offset and the size of the output stream.

16. The one or more memory devices of claim 14, wherein the IPS offset further represents the maximum offset by which the write pointer position of the output stream exceeds the read pointer position for the input stream when a write pointer for the output stream is initialized at a zero value and read pointer for the input stream is initialized at a value equal to a difference between a length of the output stream and a length of the input stream.

17. The one or more memory devices of claim 14, wherein the computer process further comprises:
reading the data of the compressed data stream sequentially into a continuous end portion of the allocated memory space, the continuous end portion corresponding with an end portion of the allocated memory space.

18. The one or more memory devices of claim 14, wherein a last byte in the compressed data stream is stored in a last physical block in the allocated memory space.

19. The one or more memory devices of claim 14, wherein decompressing the compressed data stream in-place further comprises sequentially writing values of the output stream starting at a first data block in the allocated memory space.

20. The one or more memory devices of claim 14, wherein the memory space is a continuous sequence of sequential physical blocks.

* * * * *